US006515712B1

(12) United States Patent
Jeong

(10) Patent No.: US 6,515,712 B1
(45) Date of Patent: Feb. 4, 2003

(54) SIGNAL DISTORTION COMPENSATING APPARATUS AND METHOD IN DIGITAL TV TRANSLATOR

(75) Inventor: Chang Seop Jeong, Seoul (KR)

(73) Assignee: LG Information & Communications, Ltd., Seoul (KR)

( * ) Notice: Subject to any disclaimer, the term of this patent is extended or adjusted under 35 U.S.C. 154(b) by 0 days.

(21) Appl. No.: 09/618,556

(22) Filed: Jul. 18, 2000

(30) Foreign Application Priority Data

Jul. 31, 1999 (KR) ........................................... 99-31607
Jul. 31, 1999 (KR) ........................................... 99-31608

(51) Int. Cl.[7] ................................................ H04N 5/21

(52) U.S. Cl. ....................... 348/608; 348/723; 348/724; 375/296

(58) Field of Search ................................ 348/608, 613, 348/723, 724, 607, 725, 726; 375/296, 321, 285, 277; H04N 5/21, 5/38, 5/40, 5/455

(56) References Cited

U.S. PATENT DOCUMENTS 5,572,249 A * 11/1996 Ghosh ........................ 348/608
6,185,261 B1 * 2/2001 Creigh et al. ............... 375/296
6,246,286 B1 * 6/2001 Persson ....................... 375/296
6,246,717 B1 * 6/2001 Chen et al. ................. 375/226
6,278,743 B1 * 8/2001 Templin ...................... 375/296
6,281,936 B1 * 8/2001 Twitchell et al. ........... 348/723
6,285,412 B1 * 9/2001 Twitchell .................... 348/608

* cited by examiner

*Primary Examiner*—John Miller
*Assistant Examiner*—Trang U. Tran
(74) *Attorney, Agent, or Firm*—Fleshner & Kim, LLP

(57) ABSTRACT

A signal distortion compensating apparatus and method in a digital TV translator are provided that extract a reference signal from a modulator output of a digital TV translator, and conduct a pre-correction based on the extracted reference signal to compensate for a signal distortion involved in the digital TV translator. The compensating apparatus can include a modulator that modulates an input signal while conducting a distortion pre-correction controlled by a control signal applied thereto on the input signal. The modulator outputs baseband signals divided from the input signal. A signal processing unit processes the signals outputted from the modulator, and transmits the resultant signal to subscribers. An auto correction unit compares the signal, which is outputted in a distorted state from the signal processing unit, with a reference signal derived from the baseband signals output by the modulator, and generates the control signal based on the result of the comparison.

16 Claims, 3 Drawing Sheets

620
610 621 622 623 Antenna
Data VSB Modulator IF Up-Converter RF IPA HPA Directional Coupler 640
630
670
673 VSB Receiving Unit 672 671
I Q A/D Converter I-Q Channel Seperator Down-Converter
674 675
104BUS
Synchronous Signal Detector RF Controller
681 682
VSB Demodulator Linear/Non-Linear Characteristic Correction Algorithm Processor 680
VSB
Computer-Based Control Unit
RS-232C

SIGNAL DISTORTION COMPENSATING APPARATUS AND METHOD IN DIGITAL TV TRANSLATOR

BACKGROUND OF THE INVENTION

1. Field of the Invention

The present invention relates to a signal distortion compensating apparatus and method, and more particularly to a signal distortion compensating apparatus and method in a digital TV translator.

2. Background of the Related Art

A variety of linearizing techniques have been proposed to compensate for non-linear behaviors of radio frequency (RF) high-power amplifiers (HPAs) to allow those RFHPAs to meet a standard associated with digital communication systems. Representative related art linearizing methods include a pre-distortion scheme, a feed-forward scheme, and a look-up table (LUT) scheme using a vector signal analyzer.

First, a linearizing method based on the related art pre-distortion scheme will be described. In accordance with this linearizing method, a pre-distorter is arranged upstream from the main amplifier in an amplifying system. The pre-distorter has characteristics opposite to those of the main amplifier. Thus, the upstream pre-distorter compensates for a signal distortion occurring in a particular direction in terms of gain and phase characteristics when an input signal passes through the main amplifier, thereby maintaining the output signal from the amplifying system to be the same as the input signal in terms of characteristics. The related art pre-distortion linearizing method makes it possible to obtain outputs improved in non-linearity.

In accordance with a linearizing method based on the related art feed-forward scheme, a delay line and an error amplifier are used. When an output signal from a main amplifier amplifying an input signal contains distorted intermodulation components, a 180° phase adjustment is conducted for those distorted intermodulation components by the delay line and the error amplifier to offset phase distortions of the intermodulation components. As a result, only the signal components similar to the components of the original input signal are outputted.

However, both of the above described related art pre-distortion and feed-forward linearizing methods can be implemented only with hardware configurations. Further, they are limited and problenmatic in that only the linear distortion can be compensated.

For this reason, a related art linearizing method based on a look-up table scheme using a vector signal analyzer has been mainly used. FIG. 1 is a block diagram schematically illustrating a related art signal distortion compensating apparatus applied to digital TV translators.

Referring to FIG. 1, the related art signal distortion compensating apparatus includes a transmitting unit 100 and a linear/non-linear correction receiving unit 200. The transmitting unit 100 includes a modulator 110 consisting of a vestigial sideband (VSB) processor 111, a linear filter 112, and a non-linear pre-corrector 113. The transmitting unit 100 also includes an intermediate frequency (IF) modulator 120, an up-converter 130, an intermediate power amplifier (IPA) 140, an HPA 150, a directional coupler 160, and an antenna 170. The linear/non-linear correction receiving unit 200 includes a vector signal analyzer 210 consisting of a down-converter 211 and a demodulator 212, and a computer 220.

FIG. 2 is a block diagram schematically illustrating an internal software configuration of the computer 220 for producing a reference signal associated with a distorted signal in the related art signal distortion compensating apparatus shown in FIG. 1. Referring to FIG. 2, the internal software configuration of the computer 220 includes a termination slice unit 221 a linear filter unit 222, a non-linear pre-corrector 223, a root raised cosine (RRC) filter unit 224, a scaling unit 225, a pilot signal recovering unit 228, a complex division unit 226, and a look-up table (LUT) storing memory 227. The related art signal distortion compensating apparatus will now be described in additional detail, in conjunction with FIGS. 1 and 2.

Input data is first applied to the VSB processor 111, which in turn conducts a channel coding for the input signal, thereby producing symbols. The produced symbols are applied to the linear filter 112, which in turn produces an in-phase (I) signal and a quadrature (Q) signal, based on the symbols.

The I and Q signals from the linear filter 112 are transmitted to the IF modulator 120, and then to the up-converter 130. The I and Q signals are subjected to a frequency up-conversion while passing through the up-converter 130. The resultant signals pass through the IPA 140 and HPA 150. The resultant output signal from the HPA 150 is transmitted as a TV signal for general subscribers over the antenna 170 after passing through the directional coupler 160.

However, the TV signal, which is transmitted to general subscribers from the antenna 170, may involve a distortion because the VSB signal outputted from the baseband modulator 110 may be distorted because of non-linear factors of temperature, degradation, and noise while passing through the IF modulator 120, IPA 140, and HPA 150. To correct such a signal distortion, distortion components are extracted from the output signal of the HPA 150 through the directional coupler 160. Based on the extracted distorted signal, a reference signal is also produced in accordance with a termination slice scheme. The reference signal is then compared with the distorted signal. Based on the result of the comparison, the signal distortion of the transmitting unit 100 is measured.

That is, the extracted distorted signal from the directional coupler 160 is applied to the down-converter 211 of the vector signal analyzer 210 that down-converts the up-converted frequency signal into an IF signal of 44 MHz. The resultant signal outputted from the clown-converter 211 passes through the demodulator 212, which in turn extracts I and Q digital data.

Based on the extracted I and Q digital signals from the demodulator 212, a reference signal is produced using the internal software of the computer 220 to correct a distortion in the transmission signal outputted from the transmitting unit. The software producing the reference signal consists of a routine for producing a reference signal for distortion correction based on a distorted signal, which is illustrated in FIG. 2.

Referring to FIG. 2, a source reference signal is produced in the termination slice unit 221 based on the distorted signal. The source reference signal is then sequentially processed by the linear filter unit 222 and the non-linear pre-corrector 223, so that it has the same signal as that of the output from the modulator shown in FIG. 1.

Since the distorted signal has been subjected to a root raised cosine filtering process, a pilot removal process, and a scaling process while passing through the vector signal analyzer, the reference signal should also be subjected to those processes so that it can be compared with the distorted signal. To this end, those processes are implemented in a software fashion by the RRC unit 224 and the scaling unit 225.

The resultant reference signal is then applied to the complex division unit 226 at which the distorted signal emerging from the pilot signal recovering unit 228 is also received. Based on the distorted signal and the reference signal extracted using the distorted signal, the complex division unit 226 produces an LUT coefficient for error calculation and non-lineaarity correction.

The produced LUT coefficient is temporarily stored in the LUT storing memory 227, and then inputted to the linear filter 112 and the non-linear pre-corrector 113 via a standard serial cable such as an RS-232C. The linear distortion may be corrected using an adaptive complex equalizer included in the vector signal analyzer.

As described above, the related art signal distortion compensating apparatus and method applied to digital TV translators have various problems. First, it is necessary to use additional devices such as the vector signal analyzer and computer, which result in a great increase in costs. Second, the signal distortion compensation method based on the look-up table scheme using the vector signal analyzer requires a lengthened period of time for coefficient calculation because it uses software processing. Third, the signal distortion compensation method based on the look-up table scheme using the vector signal analyzer involves a complicated production of the reference signal in that the RF signal outputted after passing through the IF modulator, IPA, and HPA is down-converted again. Fourth, the vector signal analyzer involves an inconvenience in transportation at least in the case when it is to be used for an unmanned translator installed at an alpine region because it is heavy.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide an apparatus and method of using same that solves one or more problems caused by the limitations and disadvantages of the related art.

Another object of the present invention is to provide a signal distortion compensating apparatus and method in a digital TV translator that extracts a reference signal from a modulator output of a digital TV translator, and conducts a pre-correction based on the extracted reference signal to compensate for a signal distortion involved in the digital TV translator.

Another object of the present invention is to provide a signal distortion compensating apparatus and method in a digital TV translator that compensates for distorted signals using a software control technique without using additional hardware.

Another object of the present invention is to provide a signal distortion compensating apparatus and method that removes or reduces non-linearity resulting from non-linear devices such as high power amplifiers having non-linear characteristics, or other factors such as degradation or temperature variation.

In order to achieve at least the above-described objects of the present invention in a whole or in parts, there is provided a signal distortion compensating apparatus in a digital TV translator that includes a modulator that modulates an input signal, wherein the modulator outputs baseband signals divided from the input signal, a signal processor that processes the baseband signals from the modulator, and transmits a resultant signal to subscribers, and an auto correction unit that compares the resultant signal outputted by the signal processor in a distorted state with a reference signal derived from the baseband signals of the modulator, and generates a control signal based on the comparison, wherein the modulator receives the control signal and conducts a distortion pre-correction for the input signal.

To further achieve the above-described objects of the present invention in a whole or in parts, there is provided a signal distortion compensating apparatus in a digital TV translator that includes a vestigial sideband (VSB) modulator that modulates an input signal, a signal processor that processes an output signal from the VSB modulator and transmits the processed signal to subscribers, a VSB receiver that receives the processed signal output by the signal processor and generates a VSB demodulation signal based on the processed signal, and a controller that receives the VSB demodulation signal from the VSB receiver, demodulates the VSB demodulation signal, calculates a distortion pre- correction value based on the demodulated signal, and controls the VSB modulator based on the calculated distortion pre-correction value.

To further achieve the above-described objects of the present invention in a xv hole or in parts, there is provided a signal distortion compensating method in a digital TV translator that includes modulating an input signal, dividing baseband signals from the modulated signal, and outputting the divided baseband signals, processing the divided baseband signals to transmit resultant signals to subscribers, and comparing one of the resultant signals, which is distorted during the processing step with an associated one of the divided baseband signals as a reference signal and generating a distortion correction signal, wherein the modulating step further performs pre-distortion correcting responsive to the distortion correction signal.

To further achieve the above-described objects of the present invention in a whole or in parts, there is provided a signal distortion compensating method in a digital TV translator that includes modulating an input signal to output modulated signals, processing the modulated signals and transmitting a resultant signal to subscribers, processing a signal distorted from each of the modulated signals during an execution of the step to extract distortion components from the distorted signal, executing a vestigial sideband demodulation for the distortion components extracted from the distorted signal, and calculating a correction value for the distorted signal based on the demodulated distortion components.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
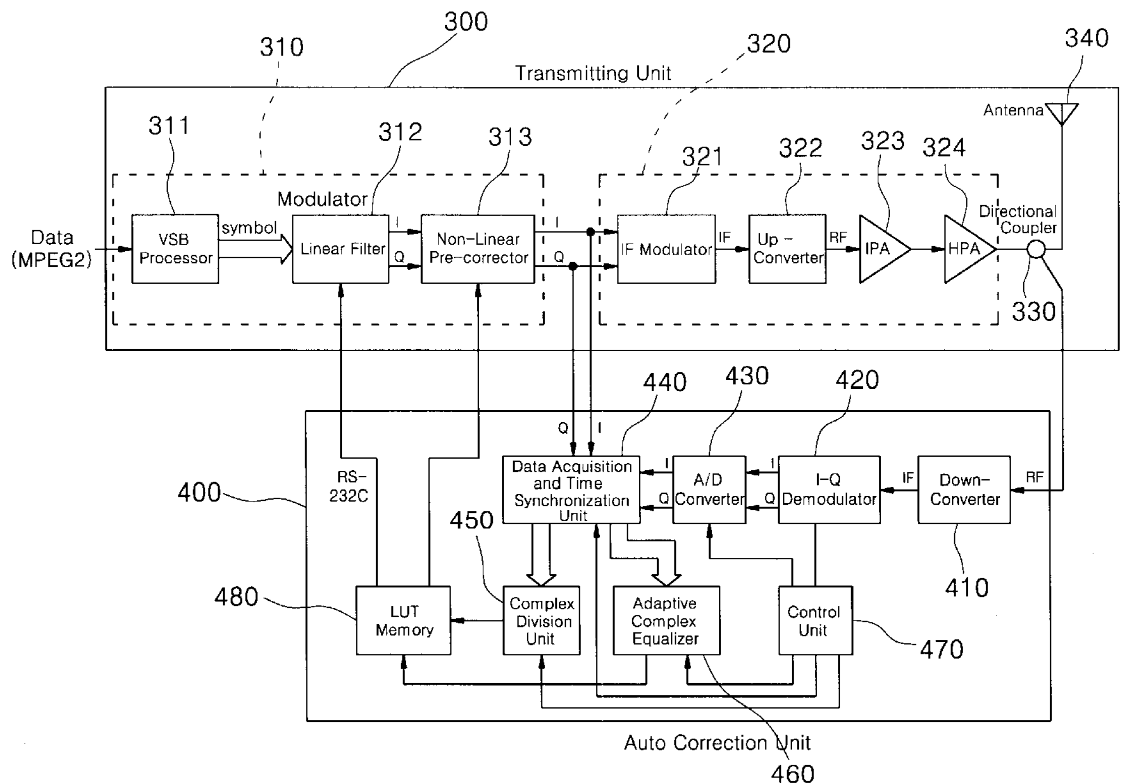
FIG. 3 is a block diagram schematically illustrating a first preferred embodiment of a signal distortion compensating apparatus in a digital TV translator in accordance with the present invention.

FIG. 3 is a block diagram schematically illustrating a first preferred embodiment of a signal distortion compensating apparatus in a digital TV translator in accordance with the present invention. As shown in FIG. 3, the digital TV translator according to the first preferred embodiment includes a transmitting unit or transmitter 300 and an automatic correction unit 400.

The transmitting unit 300 includes a modulator 310 preferably having a VSB processor 311, a linear filter 312, and a non-linear pre-corrector 313. The transmitting unit 300 also includes a signal processing unit 320 preferably having an IF modulator 321, an up-converter 322, an IPA 323 and an HPA 324. The transmitting unit 300 further includes a directional coupler 330 and an antenna 340. The automatic correction unit 400 includes a down-converter 410, an I and Q signal demodulator 420, an analog/digital (A/D) converter 430, a data acquisition and time synchronization unit 440, a complex division unit 450, an LUT storing unit 480, an adaptive complex equalizer 460 and a control unit 470.

Operations of the first preferred embodiment of the signal distortion compensating apparatus in the digital TV translator will now be described in conjunction with FIG. 3. Input data, which in this case is a digital signal converted to have a Moving Picture Expert Group 2 (MPEG2) format, is first applied to the VSB processor 311 that conducts a channel coding for the input signal to produce symbols. The produced symbols are processed by the linear filter 312 that produces an I signal and a Q signal based on those symbols. The I and Q signals from the linear filter 312 are transmitted to the IF modulator 321, and then to the up-converter 322. The I and Q signals are subjected to a frequency up-conversion while passing through the up-converter 322.

The up-converted signals pass through the IPA 323 and HPA 324. The resultant output signal from the HPA 324 is transmitted as a TV signal for general subscribers over the antenna 330 after passing through the directional coupler 330.

However, the VSB signal outputted from the modulator 310 may be distorted because of non-linear factors of temperature, degradation, and noise while passing through the IF modulator 321, the up-converter 322, the IPA 323, and the HPA 324. Such a distortion of the VSB signal may be a non-linear distortion or a linear distortion. The following description is made in conjunction with the compensation of the VSB signal preferably for both the non-linear distortion and the linear distortion.

Figure 4:
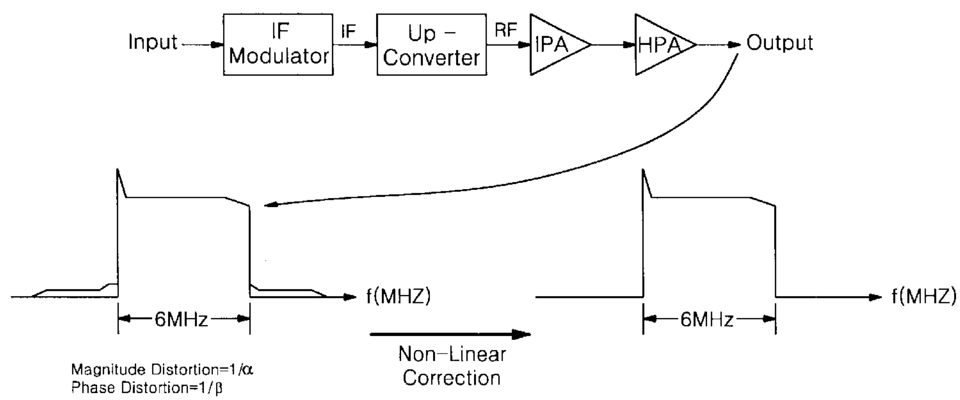
FIG. 4 is a diagram illustrating a correction for a non-linear distortion of VSB signals.

FIG. 4 is a diagram illustrating a correction for the non-linear distortion of the VSB signal. As shown in FIG. 4, it can be determined that the non-linear distortion of the VSB signal is generated while having a function relation with amplitude and phase.

Such a non-linearly distorted signal can preferably be corrected using a signal distortion compensating method in which the distorted signal is compared with a reference signal to calculate the distortion thereof. The reference signal can preferably be derived from the output of the modulator 310 included in the transmitting unit 300.

Further, the distorted signal outputted from the HPA 324 and fed back via the directional coupler 330 is applied to the down-converter 410 that down-converts the applied RF signal into an IF signal preferably having a frequency band of 44 MHz. The resultant signal outputted from the down-converter 410 passes through the I and Q demodulator 420, which in turn extracts I and Q signals. The A/D converter 430 receives the I and Q signals, and converts them to have the same form as the output signal from the modulator 310 of the transmitting unit 300.

To synchronize in terms of time the distorted signal and the reference signal with each other, both the distorted signal and the reference signal are applied to the data acquisition and time synchronization unit 440. Using a cross-correlation process, the data acquisition and time synchronization unit 440 preferably synchronizes the distorted signal with the reference signal in terms of time.

The synchronization between the reference signal and the distorted signal can be obtained by calculating a correlation of the distorted signal with respect to the reference signal. The data acquisition and time synchronization unit 440 then shifts the distorted signal in a direction exhibiting a higher correlation with respect to the reference signal, and derives a synchronization value at a point where the distorted signal exhibits a highest correlation with respect to the reference signal.

Finally, an LUT coefficient for error calculation and non-linear distortion correction is preferably produced in the complex division unit 450 using the synchronized reference and distorted signals. The produced LUT coefficient is temporarily stored in the LUT storing unit 480.

Productions of LUT coefficients can be carried out as follows. First, the reference and distorted signals are normalized in magnitude. Then an error of the reference signal from the distorted signal is calculated. The calculation is achieved by conducting a complex division for the normalized reference and distorted signals because those normalized reference and distorted signals have a complex form of I and Q signals as shown in equation 1 as follows.

$$\frac{V_{ref}}{V_{dis}} = \frac{V_P}{V_D} = \alpha + j\beta \tag{1}$$

$$\alpha = \frac{(VP_1 * VD_1) + (VP_Q * VD_Q)}{(VD_1)^2 + (VD_Q)^2}$$

$$\beta = \frac{(VP_1 * VD_1) - (VP_Q * VD_Q)}{(VD_1)^2 + (VD_Q)^2}$$

In Equation 1, "$VP_1$" represents an I signal of the reference signal, "$VP_Q$" represents a Q signal of the reference signal, "$VD_1$" represents an I signal of the distorted signal, and "$VD_Q$" represents a Q signal of the reference signal. As shown in Equation 1, the gain and phase values in the non-linear pre-corrector 313 included in the modulator 310 are initially 0 and 1, respectively. Accordingly the initial output signal from the modulator 310 may be expressed as Equation 2 as follows:

$$(I+jO)^*(I+jQ)=I+jQ \quad (2)$$

The initial output signal from the modulator 310 is varied after being processed by a non-linear correction algorithm. The control unit 470 performs a control for sending an output from the complex division unit 450 to the non-linear pre-corrector 313 of the modulator 310 included in the transmitting unit 300 as a coefficient for the correction of the non-linearly distorted signal. Thus, the non-linear characteristics of the transmitting unit 300 are pre-corrected.

The auto correction unit 400 can be implemented using very simple hardware and software configurations. However, the present invention is not intended to be so limited. For example, where the auto correction unit 400 is implemented in the form of a digital signal processor (DSP), even the simple hardware configuration can be eliminated.

Figure 5:
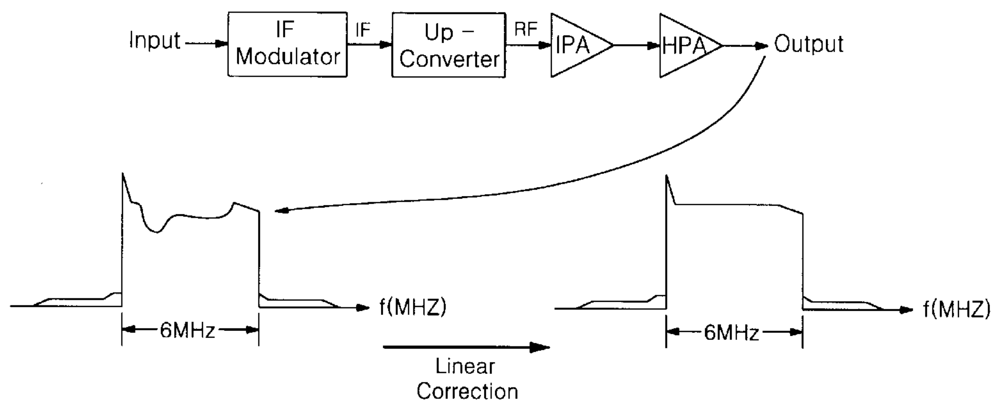
FIG. 5 is a diagram illustrating a correction for a linear distortion of VSB signals.

FIG. 5 is a diagram illustrating a correction for the linear distortion of the VSB signal. As shown in FIG. 5, it can be determined that a linear distortion is generated at a bandwidth of 6 MHz of the VSB signal while having a function relation with frequency. Due to such a linear distortion, the VSB signal exhibits a non-flat channel form.

To compensate for such a linear distortion, the output signal from the data acquisition and time synchronization unit 400 is processed by a zero-forcing, least means square (LMS) process or algorithm or the like while passing through the adaptive complex equalizer 460 under the control of the control unit 470. As a result, a tap coefficient for the correction of the linear distortion is produced by the adaptive complex equalizer 460.

The LMS process is preferably an adaptive process using a data channel including actual user information, and a channel for transmitting a known reference signal (training signal) to both the transmitting and receiving stages. The LMS process stably updates the filter coefficient in that it uses the reference signal. In accordance with the LMS process, a convergence of the filter coefficient to a global minimum value is ensured because the evaluation function is convex.

Figure 6:
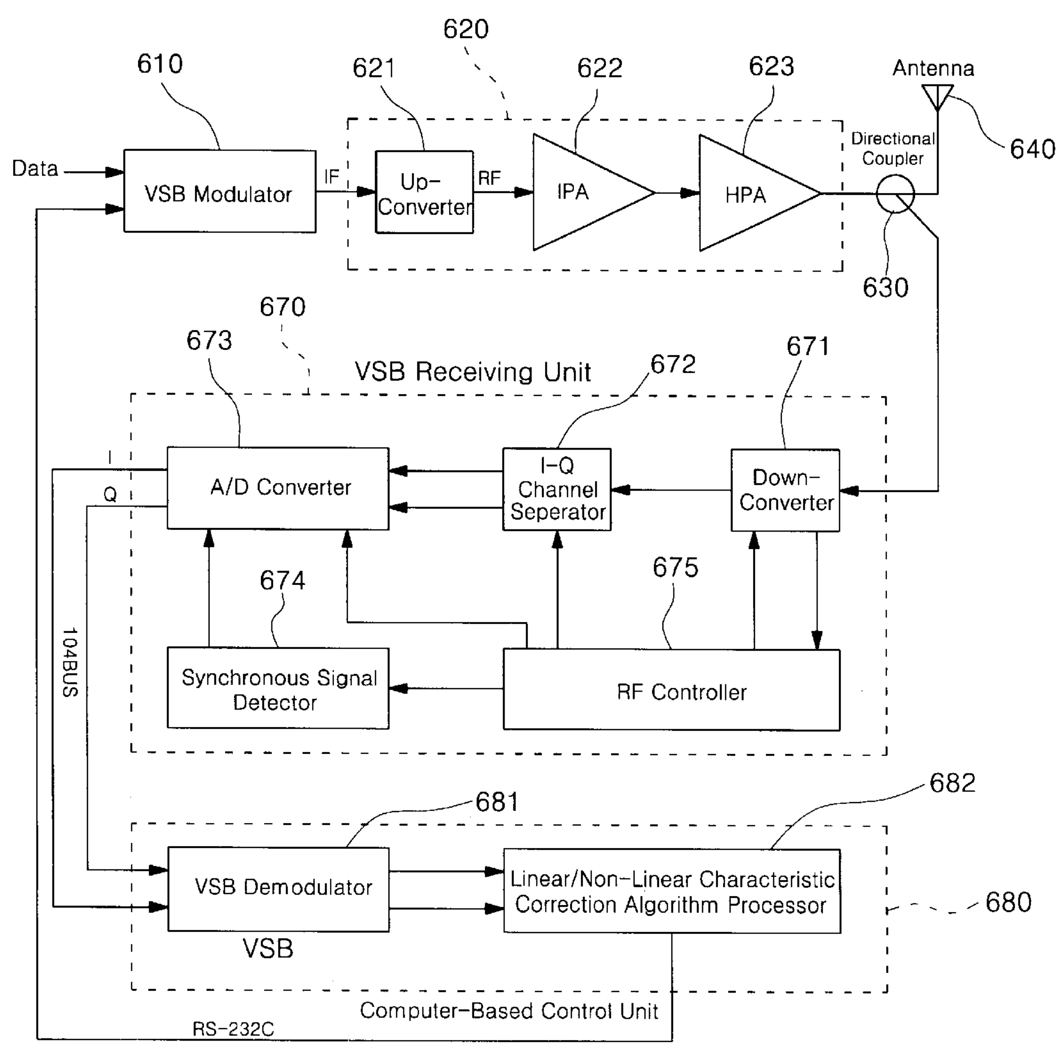
FIG. 6 is a block diagram schematically illustrating a second preferred embodiment of a signal distortion compensating apparatus in a digital TV translator in accordance with the present invention.

FIG. 6 is a block diagram schematically illustrating a second preferred embodiment of a signal distortion compensating apparatus in a digital TV translator in accordance with the present invention. As shown in FIG. 6, the signal distortion compensating apparatus according to the second preferred embodiment includes a signal processing unit 620 with a VSB modulator 610 that amplifies a digital TV signal received by the translator via a receiving antenna included in the translator, an up-converter 621 that converts an output signal from the VSB modulator 610 into a corresponding signal of an RF band, an IPA 622 and a HPA 623. The apparatus also includes a directional coupler 630, a VSB receiver or receiving unit 670, and a computer-based control unit 680.

The VSB receiving unit or receiver 670 includes a down-converter 671, an I and Q channel separator 672, an A/D converter 673, a synchronous signal detector 674, and an RF controller 675. The computer-based control unit includes a VSB demodulator 681, and a linear/non-linear characteristic correction algorithm processor 682.

Operations of the second preferred embodiment of the apparatus according to the present invention will now be described. As shown in FIG. 6, a digital TV signal, which is received by the translator via a receiving antenna included in the translator, is amplified by the VSB modulator 610. The amplified signal is converted into a corresponding signal of an RF band by the up-converter 621 and amplified again while passing through the IPA 622 and the HPA 623. The resultant signal is then applied to the directional coupler 630 and fed back to the VSB receiver 670.

The digital TV signal is distorted while passing through the up-converter 621, the IPA 622, the HPA 623, and the directional coupler 630. The distorted signal, which is received by the VSB receiver 670, is converted from the form of an RF signal of preferably 470 MHz to 806 MHz to the form of an IF signal of 44 MHz.

The resultant 44 MHz signal is separated into I and Q-channel baseband signals by the I and Q channel separator 672. The I and Q signals are then subjected to an A/D conversion by the A/D converter 673.

A synchronous signal for the A/D converter is supplied from the synchronous signal detector 674, which is preferably configured using a digital TV VSB transmitting/receiving chip. The I and Q channel separator 672 and the down-converter 671 are preferably controlled by the RF controller 675.

The I and Q signals from the VSB receiver 670 are transmitted to the computer-based control unit 680 via 104-bus lines, respectively, in order to allow the VSB demodulation thereof to be processed preferably using application software running on the computer. That is, the I and Q signals are subjected to a VSB demodulation while passing through the VSB demodulator 681 of the computer-based control unit 680, and then applied to the linear/non-linear characteristic correction algorithm processor 682, which in turn analyzes the characteristics of the applied signals.

In the case of a compensation for the characteristics of a linear input signal, the coefficients, which are for I and Q data, of a digital filter internally included in the VSB demodulator 681 are corrected based on the characteristics of the linear input signal. The corrected coefficients are fed back to the VSB modulator 610 via a serial cable such as an RS-232C.

In the case of a compensation for the characteristics of a non-linear input signal, the gain and phase values ($\alpha$ and $\beta$) in the digital filter of the VSB demodulator 681 are corrected based on the characteristics of the non-linear input signal using Equation 1 described above. The corrected values are fed back to the VSB modulator 610 via the RS-232C serial cable.

Figure 1:
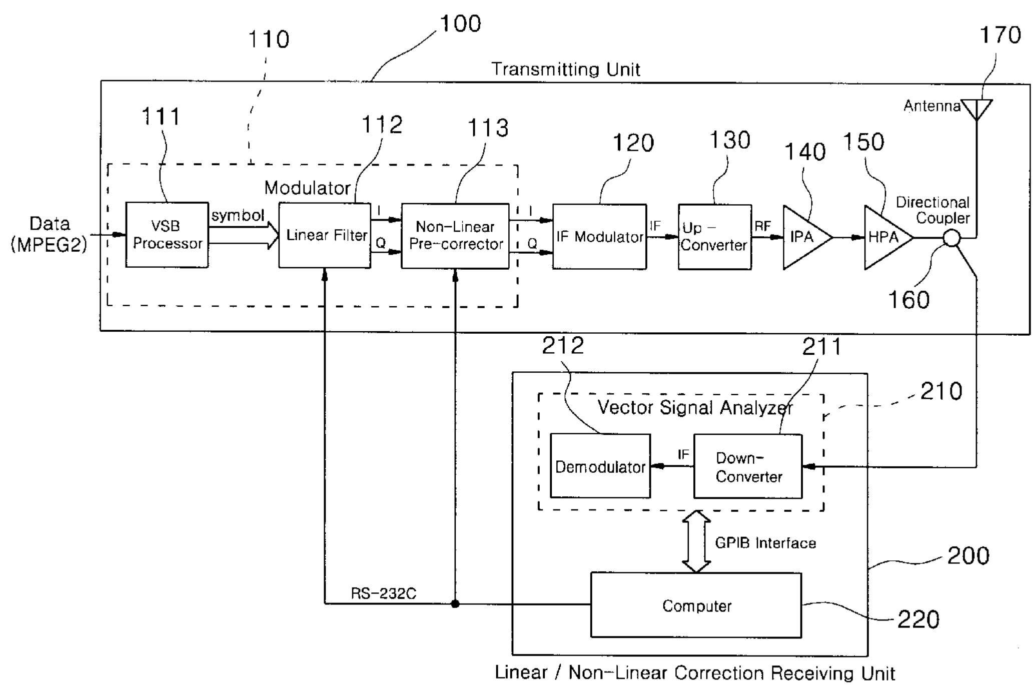
FIG. 1 is a block diagram schematically illustrating a related art signal distortion compensating apparatus applied to digital TV translators.
Figure 2:
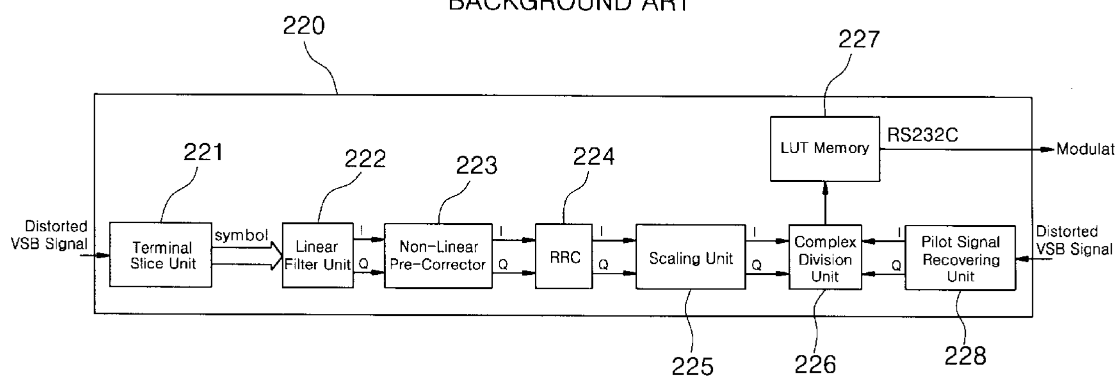
FIG. 2 is a block diagram schematically illustrating the internal software configuration of a computer for producing a reference signal associated with a distorted signal in the related art signal distortion compensating apparatus shown in FIG. 1.

The application software used for the correction of linear/non-linear characteristics is preferably the same as those in the related art case of FIG. 2. Accordingly, no detailed description will be made for the software.

Using the above mentioned operations, corrections for linear and non-linear characteristics may be conducted in a sequential fashion at the point of time desired by the user. These corrections for linear and non-linear characteristics may also be carried out in an automatic fashion.

As described above, preferred embodiments of an apparatus for signal distortion compensation and methods in a digital TV translator have various advantages. In accordance with the preferred embodiments, it is possible to correct linear and non-linear characteristics without using additional hardware such as an expensive vector signal analyzer. It is also possible to automatically execute the correction software for linear/nonlinear characteristics. Further, since a reference signal is extracted from a modulator output, there is an advantage in that superior characteristics are obtained, as compared to the related art in which a reference signal is extracted from a distorted signal.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A signal distortion compensating apparatus in a digital TV translator, comprising:

a modulator that modulates an input signal, wherein the modulator outputs baseband signals divided from the input signal;

a signal processor that processes the baseband signals from the modulator, and transmits a resultant signal to subscribers; and an auto correction unit that compares the resultant signal outputted by the signal processor in a distorted state with a reference signal derived from the baseband signals directly received from the modulator, and generates a control signal based on the comparison, wherein the modulator receives the control signal and conducts a distortion pre-correction for the input signal.

2. The signal distortion compensating apparatus according to claim 1, wherein the modulator comprises:

a vestigial sideband (VSB) processor that modulates the input signal;

a linear filter that filters an output signal from the VSB processor while conducting a linear distortion pre-correction for the output signal of the VSB processor controlled by a first component of the control signal; and a non-linear pre-corrector that conducts a non-linear distortion pre-correction for the output signal of the VSB processor controlled by a second component of the control signal.

3. The signal distortion compensating apparatus according to claim 1, wherein the auto correction unit comprises:

a down-converter that down-converts the resultant signal outputted by the signal processing unit;

a demodulator that demodulates an output signal from the down-converter;

an analog/digital(A/D) converter that converts an analog signal outputted from the demodulator into a digital signal;

a data acquisition and time synchronization unit that synchronizes in time the digital signal from the A/D converter with the baseband signals from the modulator;

a complex division unit that generates a first coefficient based on the two synchronized signals received from the data acquisition and time synchronization unit;

an adaptive complex equalizer that generates a second coefficient based on the two synchronized signals received from the data acquisition and time synchronization unit;

a memory that stores the first and second coefficients, and outputs the stored first and second coefficients as distortion pre-correction signals, respectively; and a controller that controls the demodulator, the A/D converter, the data acquisition and time synchronization unit, the complex division unit and the adaptive complex equalizer.

4. The signal distortion compensating apparatus according to claim 3, wherein the first coefficient is a first component of the control signal for a linear distortion pre-correction.

5. The signal distortion compensating apparatus according to claim 3, wherein the second coefficient is a second component of the control signal for a non-linear distortion pre-correction.

6. The signal distortion compensating apparatus according to claim 3, wherein the memory comprises a look-up table.

7. The signal distortion compensating apparatus according to claim 1, wherein the signal processor comprises an up-converter and a power amplifier connected in series, wherein the power amplifier outputs the resultant signal.

8. The signal distortion compensating apparatus according to claim 7, wherein the reference signal is derived from baseband signals that do not pass through the signal processor.

9. A signal distortion compensating method in a digital TV translator, comprising:

modulating an input signal, dividing baseband signals from the modulated signal, and outputting the divided baseband signals;

processing the divided baseband signals to transmit resultant signals to subscribers; and comparing one of the resultant signals, which is distorted during the processing step, with an associated one of the divided baseband signals used as a reference signal and generating a distortion correction signal, wherein the modulating step further performs pre-distortion correcting responsive to the distortion correction signal, and wherein the reference signal is not distorted by the processing step.

10. The signal distortion compensating method according to claim 9, further comprising:

synchronizing in time the distorted signal with the reference signal so that the signal distortion generated during the processing step is corrected based on the distortion correction signal.

11. The signal distortion compensating method according to claim 10, wherein the synchronizing step is carried out in accordance with a cross-correlation method.

12. The signal distortion compensating method according to claim 11, wherein the synchronizing step comprises:

executing the cross-correlation method for the distorted signal while setting the reference signal as a reference point to calculate a correlation of the distorted signal with respect to the reference signal;

shifting the distorted signal in a direction exhibiting a higher correlation with respect to the reference signal; and deriving a synchronization value at a point where the distorted signal exhibits a highest correlation with respect to the reference signal.

13. The signal distortion compensating method according to claim 11, wherein the comparing and generating the distortion correction signal step comprises generating look-up table coefficients for a pre-correction of the distortion based on the reference signal and the distorted signal.

14. The signal distortion compensating method according to claim 13, wherein generating a look-up table coefficients comprises:

executing a complex division for the reference signal and the distorted signal thereby generating correction coefficients for a non-linear distortion of the distorted signal; and executing an adaptive complex equalization for the reference signal and the distorted signal, thereby generating correction coefficients for a linear distortion of the distorted signal.

15. The signal distortion compensating method according to claim 9, wherein the processing the divided baseband signals processes the baseband signals sequentially through an up-converter circuit and a power amplifier to determine the resultant signals, and wherein the reference signal is derived from said one of the divided baseband signals immediately after the modulating step.

16. A signal disordering compensating method in a digital TV translator, comprising:

modulating an input signal, dividing baseband signals from the modulated signal, and outputting the divided baseband signals;

processing the divided baseband signals to transmit resultant signals to subscribers;

comparing one of the resultant signals, which is distorted during the processing step with an associated one of the divided baseband signals as a reference signal and generating a distortion correction signal, wherein the modulating step further performs pre-distortion correcting responsive to the distortion correction signal; and synchronizing in time the distorted signal with the reference signal so that the signal distortion generated during the processing step is corrected based on the distortion correction signal, wherein the synchronizing step is carried out in accordance with a cross-correlation method, and wherein the synchronizing step comprises, executing the cross-correlation method for the distorted signal while setting the reference signal as a reference point to calculate a correlation of the distorted signal with respect to the reference signal, shifting the distorted signal in a direction exhibiting a higher correlation with respect to the reference signal, and deriving a synchronization value at a point where the distorted signal exhibits a highest correlation with respect to the reference signal.

* * * * *